US009069264B2

(12) United States Patent
Warnaar et al.

(10) Patent No.: US 9,069,264 B2
(45) Date of Patent: Jun. 30, 2015

(54) METROLOGY METHOD AND APPARATUS, AND DEVICE MANUFACTURING METHOD

(75) Inventors: Patrick Warnaar, Tilburg (NL); Mark Van Schijndel, Eindhoven (NL); Michael Kubis, Düsseldorf (DE)

(73) Assignee: ASML Netherlands B.V., Veldhoven (NL)

( * ) Notice: Subject to any disclaimer, the term of this patent is extended or adjusted under 35 U.S.C. 154(b) by 537 days.

(21) Appl. No.: 13/542,319

(22) Filed: Jul. 5, 2012

(65) Prior Publication Data

US 2013/0050501 A1 Feb. 28, 2013

Related U.S. Application Data

(60) Provisional application No. 61/526,651, filed on Aug. 23, 2011.

(51) Int. Cl.
*G06K 9/46* (2006.01)
*G03F 1/44* (2012.01)
(Continued)

(52) U.S. Cl.
CPC .............. *G03F 7/70633* (2013.01); *G03F 1/44* (2013.01); *G03F 7/70683* (2013.01)

(58) Field of Classification Search
CPC ............ G03F 7/70558; G03F 7/70058; G03F 7/70066; G03F 7/70291; G03B 27/72; G01S 3/7864; G01S 3/7865; H04N 5/232; G06T 2207/10016; G06T 7/2033; G06T 7/20; G06K 9/3241
USPC ................................. 348/169; 430/30; 355/67
See application file for complete search history.

(56) References Cited

U.S. PATENT DOCUMENTS 5,825,039 A  * 10/1998 Hartley .................... 250/492.22
2004/0066517 A1 * 4/2004 Huang et al. ................. 356/509
(Continued)

FOREIGN PATENT DOCUMENTS

WO WO 2009/078708 A1 6/2009
WO WO 2009/106279 A1 9/2009
(Continued)

OTHER PUBLICATIONS

International Search Report directed to related International Patent Application No. PCT/EP2012/062555, mailed Nov. 28, 2012; 3 pages.
(Continued)

*Primary Examiner* — Sath V Perungavoor
*Assistant Examiner* — Howard D Brown, Jr.
(74) *Attorney, Agent, or Firm* — Sterne, Kessler, Goldstein & Fox P.L.L.C.

(57) ABSTRACT

A target structure including a periodic structure is formed on a substrate. An image of the target structure is detected while illuminating the target structure with a beam of radiation, the image being formed using a first part of non-zero order diffracted radiation while excluding zero order diffracted radiation. Intensity values extracted from a region of interest within the image are used to determine a property of the periodic structure. A processing unit recognizes locations of a plurality of boundary features in the image of the target structure to identify regions of interest. The number of boundary features in each direction is at least twice a number of boundaries of periodic structures within the target structure. The accuracy of locating the region is greater than by recognizing only the boundaries of the periodic structure(s).

19 Claims, 7 Drawing Sheets

(51) Int. Cl.
*G03F 7/20* (2006.01)
*G03B 27/54* (2006.01)

(56) References Cited

U.S. PATENT DOCUMENTS

| | | | |
|---|---|---|---|
| 2006/0024850 A1* | 2/2006 | Monahan et al. | 438/14 |
| 2006/0061746 A1* | 3/2006 | Kok et al. | 355/53 |
| 2008/0055609 A1* | 3/2008 | Finarov et al. | 356/625 |
| 2009/0168038 A1* | 7/2009 | Akamatsu | 355/67 |
| 2010/0055624 A1* | 3/2010 | Gronheid et al. | 430/326 |
| 2010/0075238 A1* | 3/2010 | Fonseca et al. | 430/30 |
| 2010/0119960 A1* | 5/2010 | Fonseca et al. | 430/30 |
| 2010/0123886 A1* | 5/2010 | Bijnen et al. | 355/53 |
| 2010/0231883 A1* | 9/2010 | Dodoc et al. | 355/67 |
| 2011/0027704 A1* | 2/2011 | Cramer et al. | 430/30 |
| 2011/0043791 A1* | 2/2011 | Smilde et al. | 356/128 |
| 2011/0137625 A1* | 6/2011 | Dirks et al. | 703/2 |
| 2011/0249244 A1* | 10/2011 | Leewis et al. | 355/27 |
| 2012/0033193 A1* | 2/2012 | Van Der Schaar et al. | 355/67 |
| 2012/0044470 A1* | 2/2012 | Smilde et al. | 355/53 |
| 2012/0123581 A1* | 5/2012 | Smilde et al. | 700/105 |

FOREIGN PATENT DOCUMENTS

| | | |
|---|---|---|
| WO | WO 2011/012624 A1 | 2/2011 |
| WO | WO 2012/062501 A1 | 5/2012 |

OTHER PUBLICATIONS

International Preliminary Report on Patentability and Written Opinion of the International Searching Authority directed to related International Patent Application No. PCT/EP2012/062555, issued Feb. 25, 2014; 6 pages.

* cited by examiner

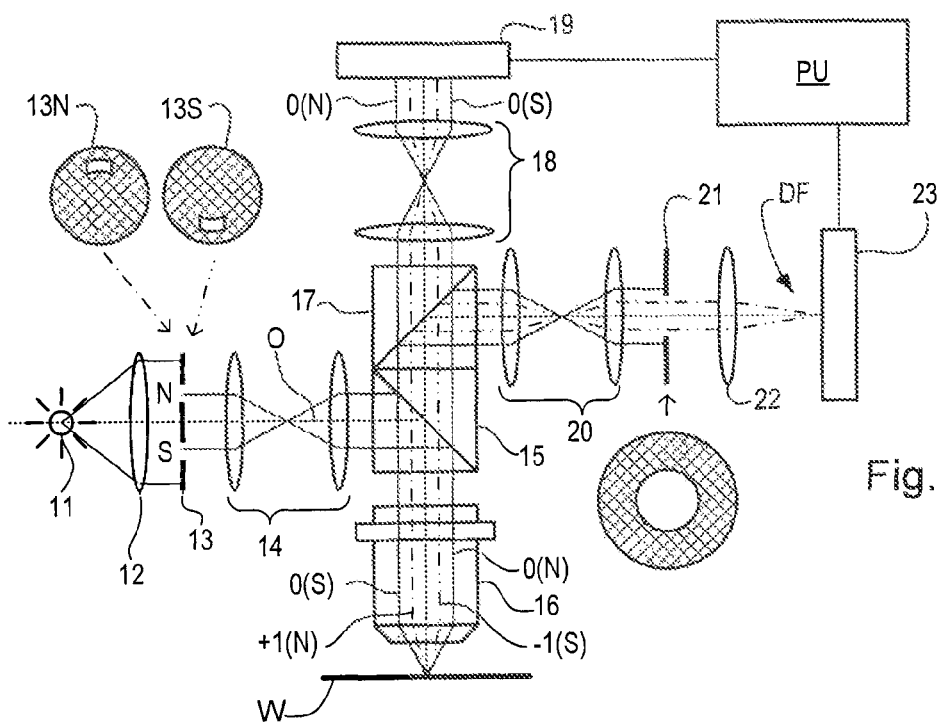
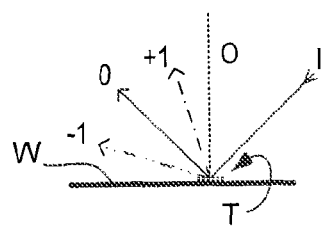 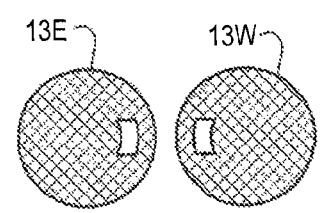 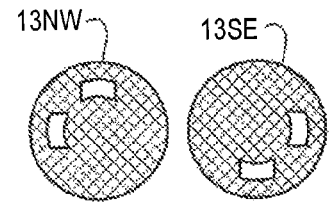
Fig. 3(b)　　Fig. 3(c)　　Fig. 3(d)
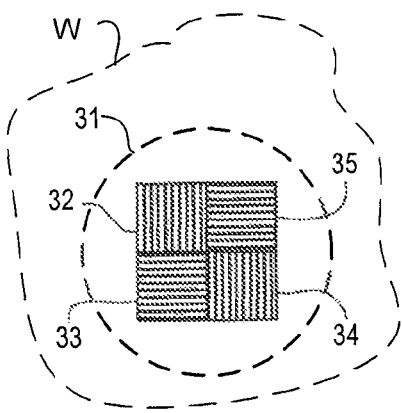 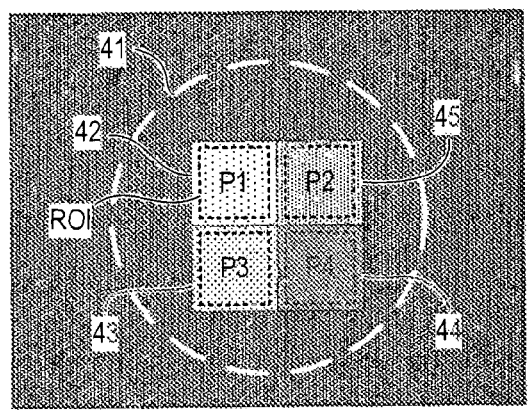
Fig. 4　　Fig. 5

METROLOGY METHOD AND APPARATUS, AND DEVICE MANUFACTURING METHOD

CROSS REFERENCE TO RELATED APPLICATIONS

This application claims the benefit under 35 U.S.C. §119(e) to U.S. Provisional Patent Application No. 61/526,651, filed Aug. 23, 2011, which is incorporated by reference herein in its entirety.

BACKGROUND

1. Field of the Present Invention

The present invention relates to methods and apparatus for metrology usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed.

In the known dark-field metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. The requirements for positioning the target within an image field of the apparatus should be relaxed, to allow greater throughput. Using pattern recognition with the dark-field detection in the image-plane, the intensities from the overlay target or targets can efficiently be separated from the intensities from the environment product structures, wherever they are located within an image field. On the other hand, to eliminate edge effects and process dependencies, the inventors desire that each region of interest within the image field should be identified not only approximately, but with high precision and repeatability. The accuracy of the pattern recognition with current targets is limited.

SUMMARY

It is desirable to provide a method and apparatus for metrology using target gratings, in which throughput and accuracy can be improved over prior published techniques.

An embodiment of the present invention in a first aspect provides a method of measuring a property of one or more periodic structures formed by a lithographic process on a substrate, the method comprising (a) using the lithographic process to form a target structure on the substrate, the target structure including one or more periodic structures on the substrate, (b) forming and detecting at least one image of the target structure while illuminating the target structure with a beam of radiation, the image being formed using a first part of non-zero order diffracted radiation while excluding zero order diffracted radiation, (c) using intensity values extracted from at least one region of interest within the image of the target structure to determine the property of a corresponding one of the periodic structures. To perform step (c), the region of interest is identified in the detected image by recognizing locations of a plurality of boundary features in the image of the target structure and calculating from the recognized locations features a location of the region of interest, and, in at least one direction, the number of the boundary features is at least twice a number of boundaries of periodic structures within the target structure.

The target structure may be a composite grating comprising a plurality of smaller gratings forming the periodic structures. The gratings may for example be overlay gratings, formed by a sequence of at least two lithographic processes. The property of the periodic structure may be asymmetry, which is indicative of overlay error.

An embodiment of the present invention in a second aspect provides an inspection apparatus configured for measuring a property of a periodic structure on a substrate, the inspection apparatus comprising: an illumination arrangement operable to deliver a beam of radiation to the substrate so as to illuminate a target structure on the substrate, the target structure including one or more periodic structures, a detection arrangement operable to form and detect an image of the target structure using radiation diffracted from the substrate, and a computational arrangement operable to extract intensity values from at least one region of interest within the image of the target structure and to use the extracted values to determine the property the periodic structure. The computational arrangement is arranged to recognize locations of a plurality of boundary features in the image of the target structure and to calculating from the recognized locations features a location of the region of interest, and, in at least one direction, the number of the boundary features is at least twice a number of boundaries of periodic structures within the target structure.

An embodiment of the present invention further provides a method of manufacturing devices, a device pattern is applied to a series of substrates using a lithographic process, the method including inspecting at least one periodic structure formed as part of or beside the device pattern on at least one of the substrates using an inspection method according to the first aspect of the present invention as set forth above, and controlling the lithographic process for later substrates in accordance with the result of the inspection method.

An embodiment of the present invention further provides a lithographic system including a lithographic apparatus and an inspection apparatus according to the second aspect of the present invention, as set forth above. The lithographic apparatus is arranged to use the measurement results from the inspection apparatus in applying the pattern to further substrates.

An embodiment of the present invention yet further provides a patterning device for use in a method of the first aspect of the present invention, as set forth above, the patterning device, when used in step (a) of the method, providing the target structure with features appropriate to produce the boundary features in the image detected in step (c).

The patterning device as may be provided in combination with a second patterning device, the two patterning devices together being adapted for use in forming the target structure with overlay gratings as the periodic structures.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIGS. 3A-3D comprises (a) a schematic diagram of a dark field scatterometer for use in measuring targets according to embodiments of the present invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

FIG. 4 depicts a known form of multiple grating target and an outline of a measurement spot on a substrate.

FIG. 5 depicts an image of the target of FIG. 4 obtained in the scatterometer of FIG. 3.

Figure 6:
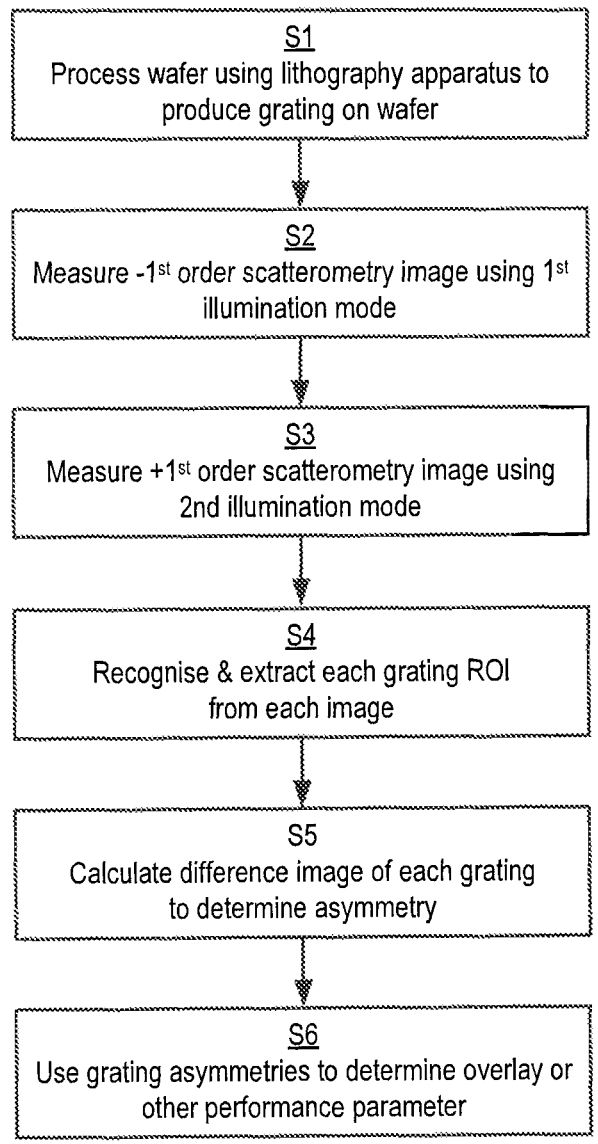

FIG. 6 is a flowchart showing the steps of an overlay measurement using the scatterometer of FIG. 3.

Figure 7A:
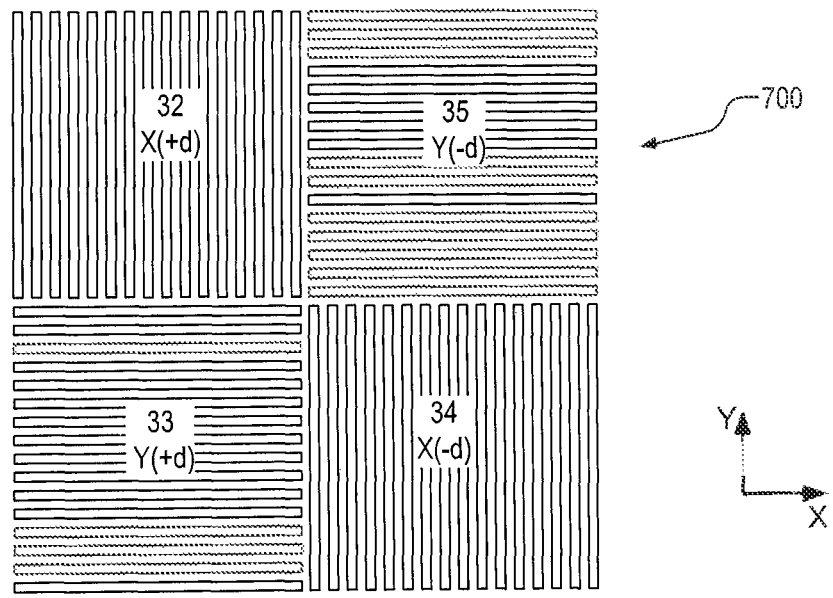
Figure 7B:
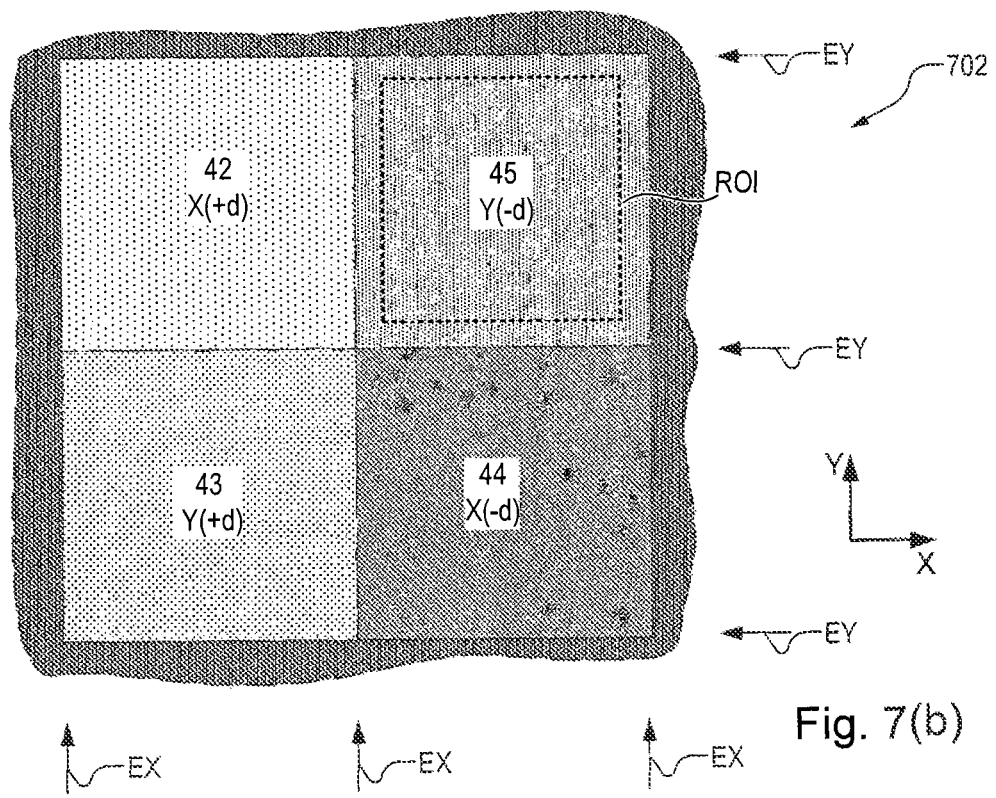

FIGS. 7A-7B depicts (a) an enlarged version of the target of FIG. 4 and (b) the problem of recognizing the region of interest in the image obtained the scatterometer.

Figure 8A:
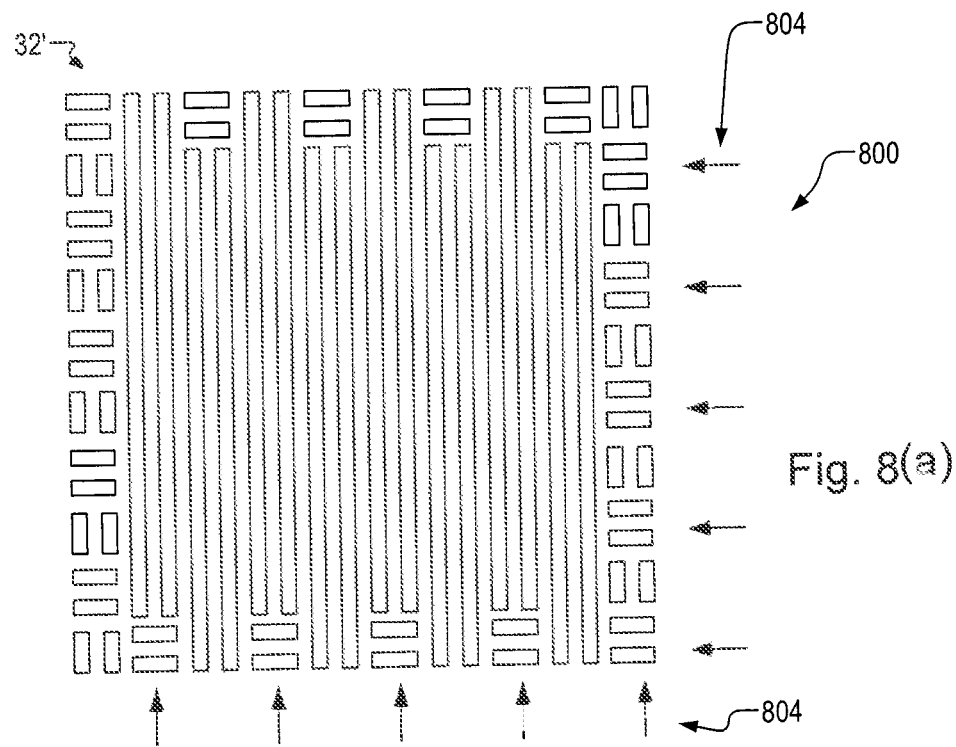
Figure 8B:
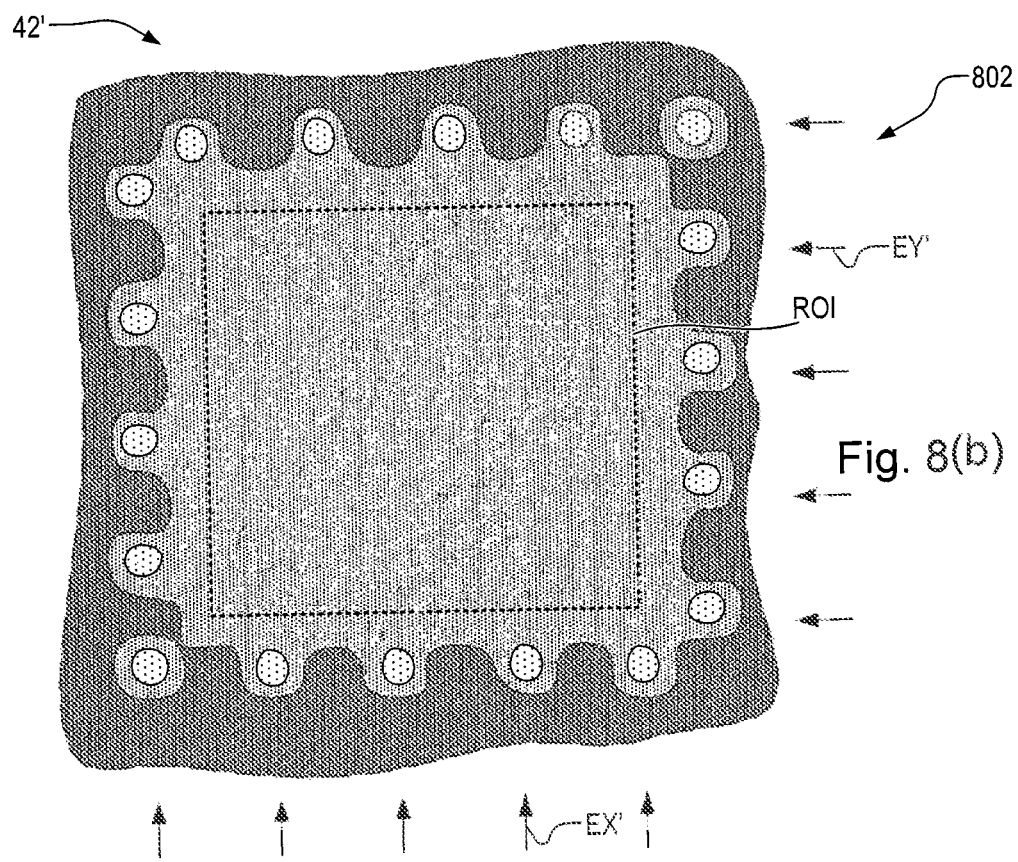

FIG. 8A-8B depicts (a) a modified grating target according to a first embodiment of the present invention and (b) an image of the modified grating in the scatterometer of FIG. 3.

Figure 9:
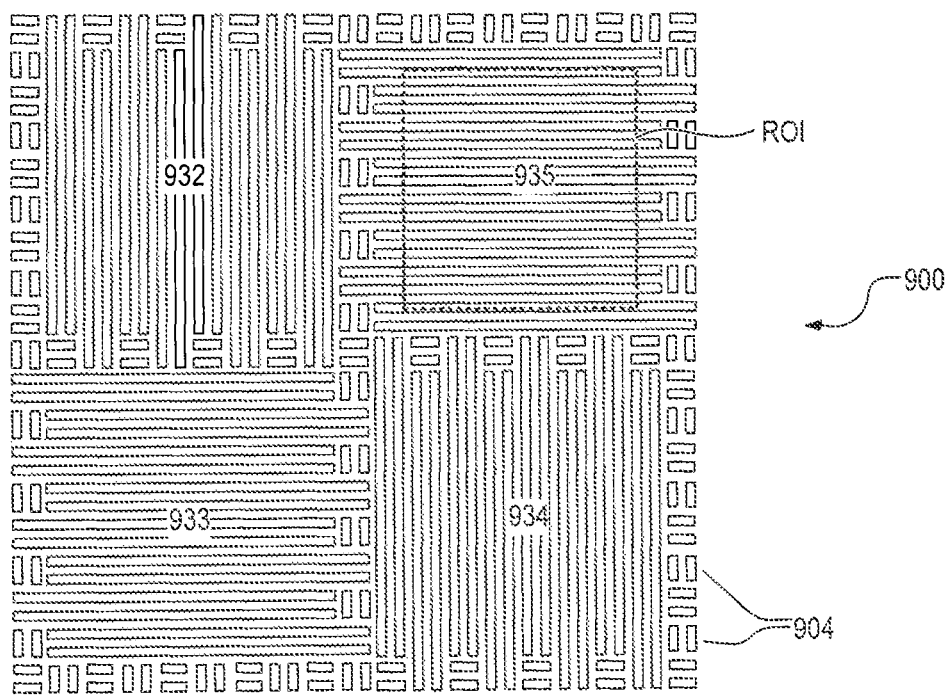

FIG. 9 depicts a multiple grating target incorporating the modified grating of FIG. 8 (a).

Figure 10:
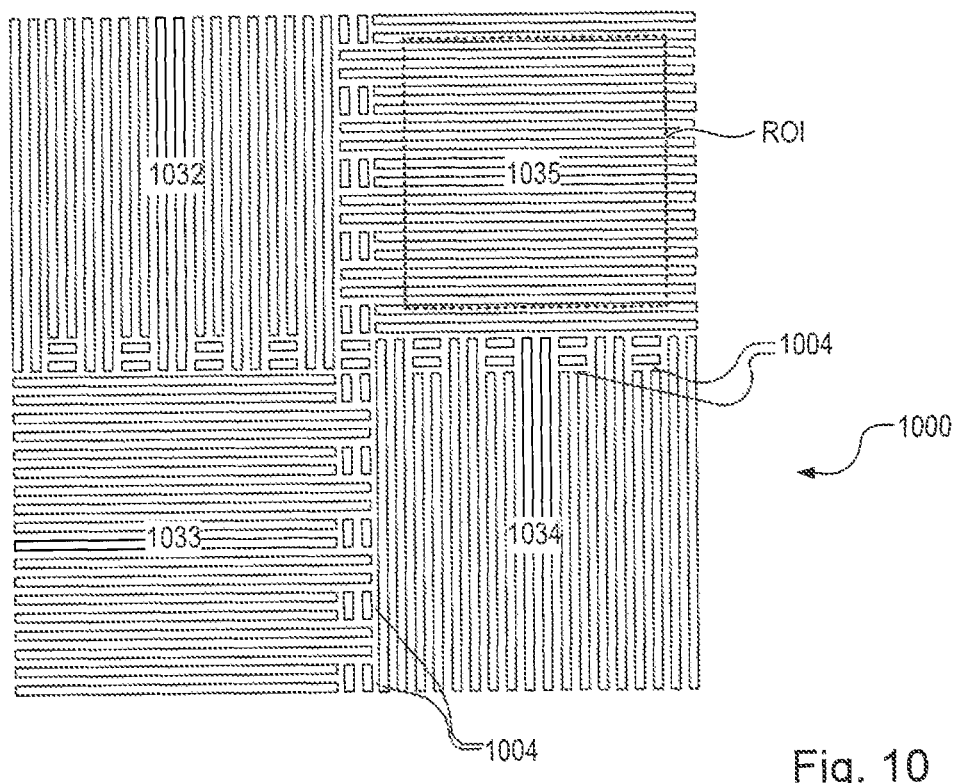
Figure 11:
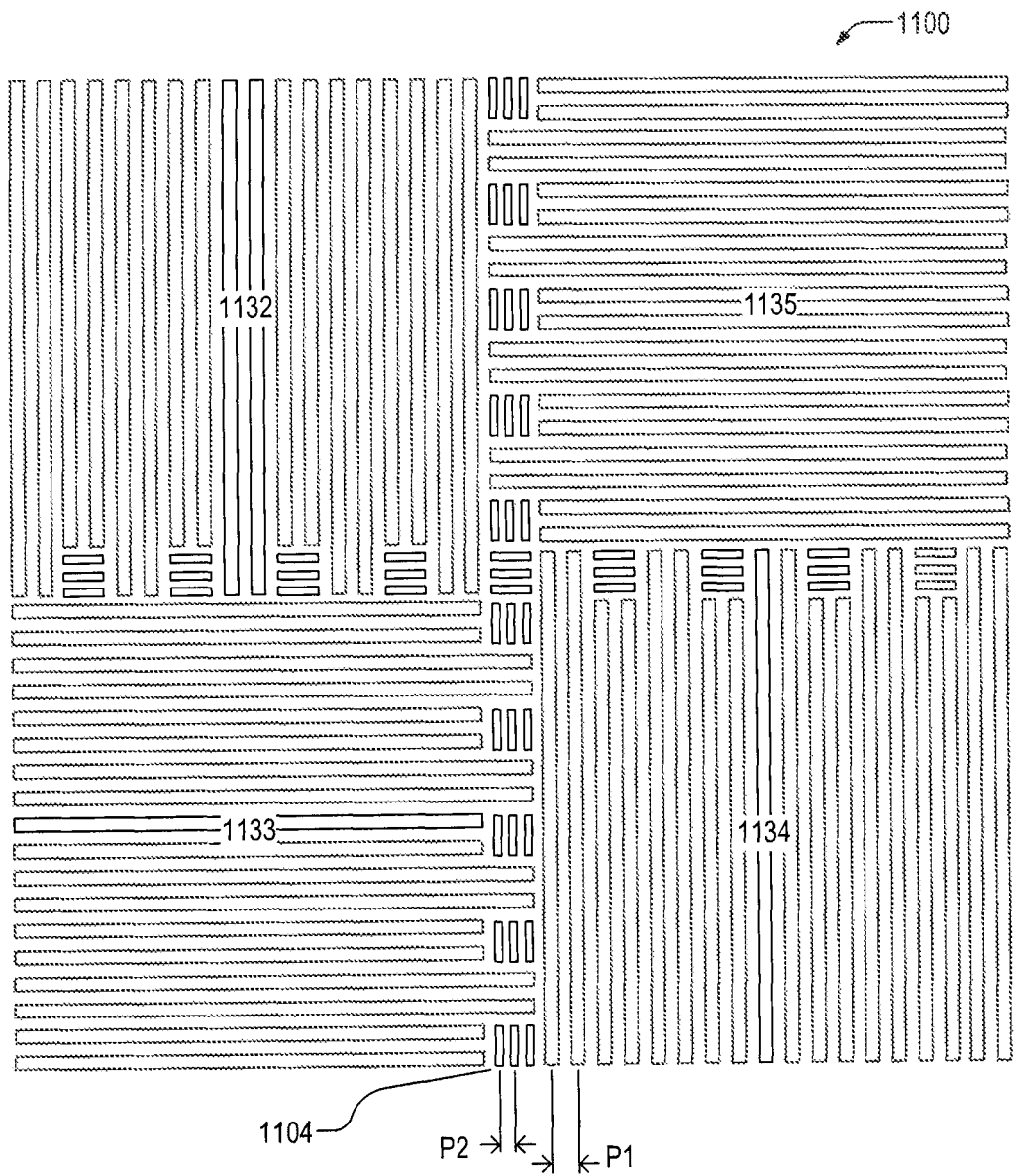

FIG. 10 depicts an alternative multiple grating target according to a second embodiment of the present invention. and FIG. 11 defects a further alternative multiple grating target according to a third embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
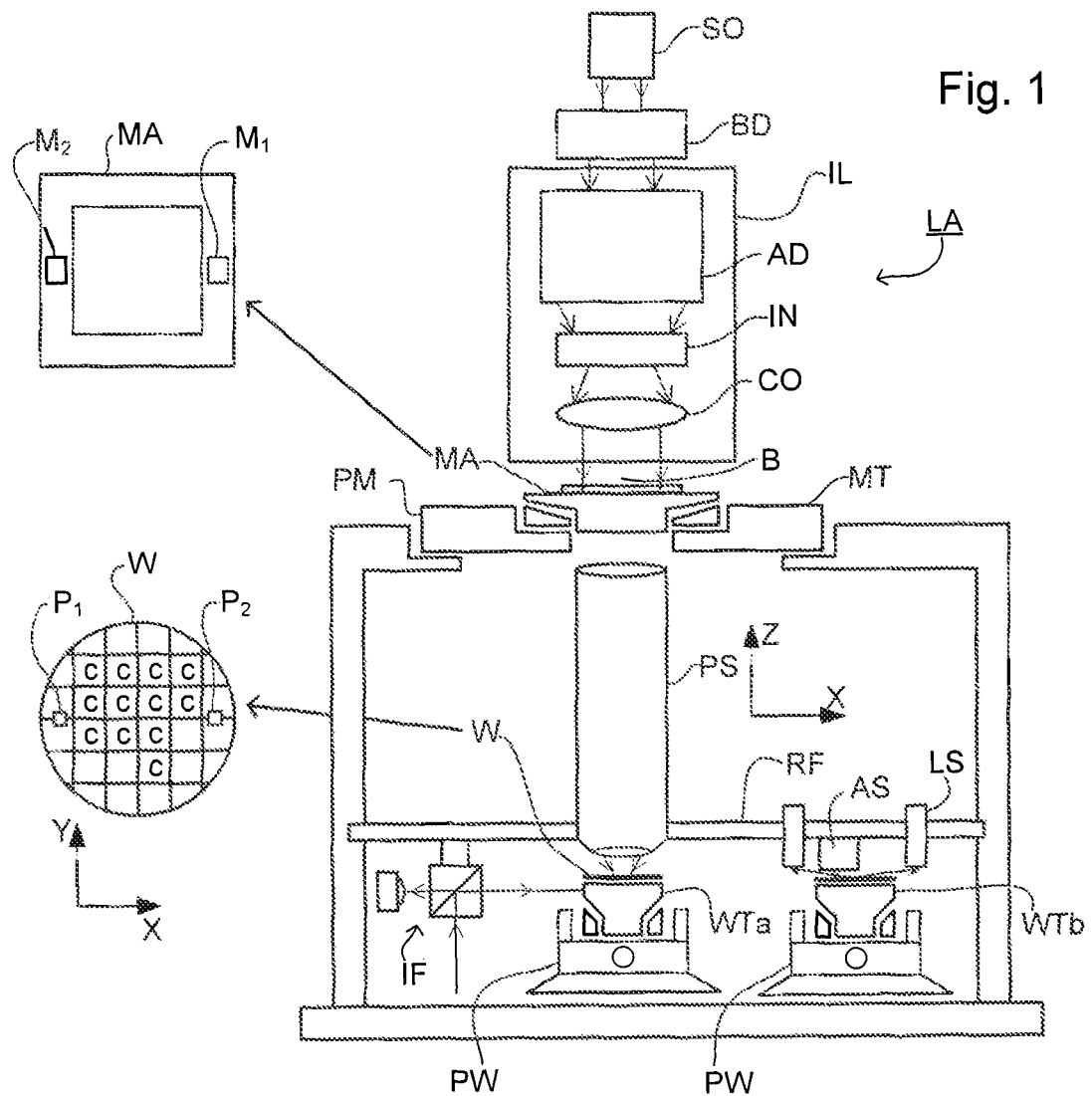
FIG. 1 depicts a lithographic apparatus according to an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type so that at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:
1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
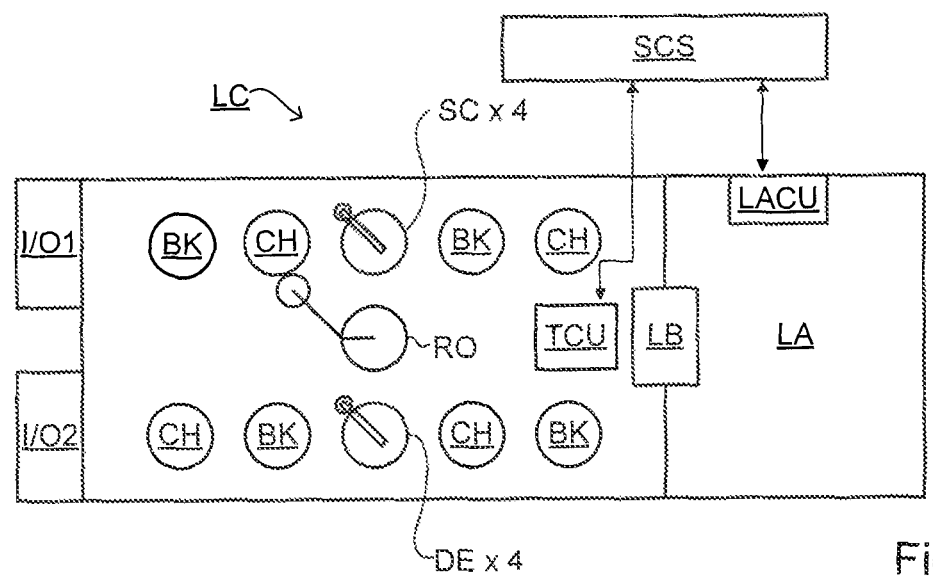
FIG. 2 depicts a lithographic cell or cluster according to an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of dark field metrology can be found in international patent applications WO 2009/078708 and WO 2009/106279 which documents are hereby incorporated by reference in their entirety. Further developments of the technique have been described in patent publications US Pub. App. Nos. 20110027704A, 20110043791A and 20120123581. The contents of all these applications are also incorporated herein by reference in their entirety. Diffraction-based overlay using dark-field detection of the diffraction orders enables overlay measurements on smaller targets. These targets can be smaller than the illumination spot and may be surrounded by product structures on a wafer. Multiple targets can be measured in one image.

A dark field metrology apparatus suitable for use in embodiments of the present invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp)

is directed onto substrate W via a beam splitter 15 by an optical system comprising lenses 12, 14 and objective lens 16. These lenses are arranged in a double sequence of a 4F arrangement. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the present invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the field stop 21, or by substituting a field stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, insert each with its own advantages and disadvantages.

In e method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 are differently biased in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the present invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

FIG. 6 illustrates how, using for example the method described in application PCT/EP2010/060894, incorporated by reference herein in its entirety, overlay error between the two layers containing the component gratings 32 to 35 is measured through asymmetry of the gratings, as revealed by comparing their intensities in the +1 order and −1 order dark field images. At step S1, the substrate, for example a semi-conductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain grey level. In step S4, a region of interest (ROI) is carefully identified within the image of each component greeting, from which intensity levels will be measured. This is done because, particularly around the edges of the individual grating images, intensity values can be highly dependent on process variables such as resist thickness, composition, line shape, as well as edge effects generally. The inventors have found that, for best accuracy in measurements, the ROI should be identified with a high repeatability, and perhaps with accuracy far greater than the pitch of the grating itself. The present application discloses techniques to improve the accuracy of identifying the ROI, as will be described below.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

In the prior applications, mentioned above, various techniques are disclosed for improving the quality of overlay measurements using the basic method mentioned above. For example, the intensity differences between images may be attributable to differences in the optical paths used for the different measurements, and not purely asymmetry in the target. The illumination source 11 may be such that the intensity and/or phase of illumination spot 31 is not uniform. Corrections can the determined and applied to minimize such errors, by reference for example to the position of the target image in the image field of sensor 23. These techniques are explained in the prior applications, and will not be explained here in further detail.

FIG. 7 (a) shows an enlarged detail of a composite grating target 700, comprising the four individual gratings 32 to 35 shown in FIG. 4. The individual grating lines of each target can be seen more clearly at this enlarged scale. The number of lines in each grating is not critical, and it may be for example in the range 5 to 100. The gratings in this example are all square, rectangular gratings can be used, if preferred. FIG. 7 (b) shows an enlarged detail of the image 702 of the composite grating 700 on the dark field image sensor 23 of the apparatus of FIG. 3. As in FIG. 5, using a particular mode of illumination, each grating 32 to 35 becomes represented in the image field of sensor 23 by a corresponding grey area 42 to 45, respectively.

In order to identify correctly a region of interest (ROI) in step S4 of the method of Figure, processing unit PU must identify the area of each grating image 42 to 45 using such edge features as are available in the image. In the simple array of four squares in the target of FIG. 7 (a), edge features are available at three positions in the X direction, and three positions in the Y direction. The locations of these edge features are labeled EX and EY in the diagram. It is found that, even using sophisticated pattern matching techniques such as the well-known Cognex software, the fact that there are only three edge features in each direction greatly limits the accuracy with which they ROI can be located.

Referring now to FIG. 8 (a), a modified grating target 800 is shown. In FIG. 8 (b), a corresponding image 802 is shown, representing the dark field image in a single diffraction order, as seen by sensor 23. As can be seen, boundary portions of the grating 800 are modified to introduce boundary features with a period larger than the period of the grating's main area. These boundary features, in the example shown, are produced by interrupting the X direction grating on the edge region. The interruptions 804 could be formed by simple blank areas. However, in this example, short bars oriented orthogonally to the grating lines are used to fill the gaps. This has the advantage that the lines of the grating will not be distorted by process effects, and the overall density of features across the target is relatively uniform. In the illustrated example, the spacing of these short bars is the same as the spacing of the grating lines. This need not be the case, as will be explained further below.

Comparing the dark field image 802 with the image 702 of the conventional grating, it can be seen how the interruptions 804 give rise to prominent features around the edge of the grey area that includes the region of interest ROI. In the simple example illustrated, along each edge of the square grating, there are now five of these 'boundary features', that can be used by the pattern recognition process of step S4. By statistically combining the identified positions of these five features, the apparatus can identify the position of the ROI with substantially greater accuracy than using only the edges of the square grating 32. If the boundaries are positioned at equal distance, a periodic fit can be applied to the data. For instance a least-squares sine fit, such as one used alignment in scanners.

By providing recognizable boundary features which are two, three or more times as numerous as the boundaries of the target gratings 32 to 35, the accuracy of recognizing the ROI can be increased. Also, the appearance of the features can be controlled by design, to make contrast, for example, less dependent on the process and illumination conditions. In the example pattern shown, the arrangement of the interruptions, and consequently the boundary features observed in the image 802, is periodic. The pitch of the boundary features is four times the pitch of the bars in the main body of the grating. In other embodiments it might be an integer multiple such as 2, 3, 4 or 5 times, for example. While this is not essential, it makes the design of the pattern simpler and makes the appearance of the boundary features more consistent. A periodic structure of the boundary features enables the use of a periodic fit, however any known structure may be fitted. For example, oddly spaced added features may also be used. When the selected configuration of the boundary features is known, it can be detected.

Referring to FIG. 9, a composite grating target 900 is shown, which includes four of the modified gratings 800, in a square array, forming a modified version of the composite grating 700 of FIG. 7. In this example, each individual grating is provided with interruptions in periodic pattern along its four edges. Where the individual gratings are adjacent one another, the interrupted portions are shared between gratings, to maximize the use of space. As shown in one of the individual grating 935, the corresponding region of interest ROI may need to be reduced in size, to avoid edge effects which will be more pronounced in the modified grating.

FIG. 10 illustrates a further example of a modified grating target 1000, which again comprises a square array of four smaller individual gratings 1032 to 1035. In this example, periodic interruptions are provided only in the inside edges of the gratings, where they meet one another. The outer edges of the composite grating comprise normal grating lines, right to the edge of the target. The ROI consequently can be made slightly larger than that in the target 900, maximizing the use of space on the substrate, and improving the quality of the intensity signal used to measure overlay. The periodic interruptions in the target 1000, provide a "crosshairs" target, which can be readily recognized by pattern recognition step S4, to locate the ROI of any of the four targets 1032 to 1035.

As noted already, in the examples of FIGS. 8, 9 and 10, the interruptions 804, 904, 1004 in each grating are filled with short bars of the opposite (orthogonal) orientation. If the target is being inspected with illumination of a single pole, that is illumination angled to measure diffraction only in the X direction or only in the Y direction, the orthogonal bars that are filling the interruptions will cause no diffraction signal, and appear dark, as in the image 802 in FIG. 8 (b). On the other hand, if the composite target is being inspected with illumination from orthogonal polls, for example using the aperture 13NW or 13SE, then the orthogonal bars will generate a diffraction signal potentially as strong as the bars of the grating, and the interruptions 804 were not appear clearly in the image, if they appear at all.

FIG. 11 shows a further modification of the grating with interruptions, that can be used for recognition of the ROI simultaneously in the X and Y direction gratings. Composite grating target 1100 is similar to the target 1000 of FIG. 10, except that the pitch P2 of the short bars in the interruptions 1104 is very different from the pitch P1 of bars in the main gratings. In this way, it can be ensured that the diffraction signals from the short bars emerge at a very different angle from the diffraction signals of the target gratings 1132 to 1135. Consequently, although the overall density of features in the target is relatively uniform, the intensity of radiation in one of the diffraction orders selected for imaging on sensor 23 will show clearly the interruptions where the short bars are located. The short bars with reduced pitch can be employed in any of the patterns shown in FIG. 8, 9 or 10. This reduced pitch can also be used where 'short bars' are positioned along the same direction as the main bars, provided that for one of the pitches the diffracted light is detected in the measurement image and for the other it isn't. Even the same pitch and direction could be used with only a difference in bias between the top and bottom layer. This latter example may give low contrast, but may be preferable depending on process limitations.

The above embodiments illustrate various patterns in which a grating target, for example an overlay grating, is modified to generate boundary features in a diffraction image. The boundary features, which may be periodically arranged, have a spacing greater than the pitch of the grating, but much less than the dimension of the gratings themselves. Deploying these patterns as targets in dark field metrology using selected orders of diffracted light, the numerous boundary features can be recognized in the dark field image, while the grating itself generates an intensity signal across the region of interest. The ROI position may be identified more accurately and consistently than with known targets. The positioning error may be two, three or more times smaller than the pitch of the grating. The positioning precision may be sub-pixel, in terms of the resolution of the measurement image.

Features of the different embodiments may be combined, as has been mentioned already above. Example patterns illustrated are in no way intended to limit the variations that maybe chosen by the skilled person. The number of bars in the gratings, the number of interruptions along and edge of the grating, the width, pitch and duty cycle of the interruptions, the number of pages of the grating where interruptions are deployed, are all examples of parameters that can be varied freely to achieve a desired performance. The number of interruptions can be odd or even, and need not be the same in the X and Y directions. In a case where it is only important to identify the ROI accurately in one direction, the interruptions or other modifications could be arranged in one direction only, rather than X and Y directions.

While the periodic features added to the gratings have been characterized as "interruptions", it will be appreciated that the grating bars between the interruptions could just as well be characterized as "extensions" of the grating lines. While it is convenient to create the periodic features by simply modifying the length of grating lines, patterns can be envisaged where some other type of modification has been applied.

In the case of an overlay target, the interruptions only need to be available in one layer (and a clear area above/below), when allowed by the process limitations. This can be used to optimize the contrast with respect to the grating area. A neighboring alignment mark (if detectable with dark-field illumination) could also be used to produce the boundary features, though such a neighboring alignment mark should be so close that it can be imaged together with the target (so within the 25 µm spot).

While specific embodiments of the present invention have been described above, it will be appreciated that the present invention may be practiced otherwise than as described. The examples above feature multiple measurements using dark field imaging techniques, where the zero order diffracted radiation is excluded from the optical path to the image sensor 23. The techniques described above can also be used to apply corrections in other types of measurement. For example, in other techniques, intensity measurements from targets may be made using zero order radiation to form an image. Where the target is smaller than an illumination spot and the image of a target component is smaller than a field of view of the measurement optical system, several intensity measurements can be performed in a single step by arranging several target components in a composite target, forming an image using the desired radiation, and separating the measurement results by detecting the intensity in different parts of the image sensed by the sensor. Since each target component in that case is then measured through a different optical path, the measurements will include a position-dependent error, in addition to the wanted variations that represent process parameters to be measured.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   forming a target structure on a substrate, the target structure including a periodic structure;
   detecting an image of the target structure while illuminating the target structure with a beam of radiation, the image being formed using a first part of non-zero order diffracted radiation while excluding zero order diffracted radiation; and
   determining a property of the periodic structure using an intensity value extracted from a region of interest within the image of the target structure,
   wherein the region of interest is identified in the detected image by recognizing locations of a plurality of boundary features in the image of the target structure and calculating, from the recognized locations, features a location of the region of interest, and
   wherein, in at least one direction, the number of the boundary features is at least twice a number of boundaries of periodic structures within the target structure.

2. The method of claim 1, wherein the periodic structure is formed with interruptions in a boundary region, the interruptions in the boundary region of the giving rise to the boundary features in the detected image of the target structure.

3. The method of claim 2, wherein each of the interruptions contains features similar in form to features of the periodic structure, but differently oriented.

4. The method of claim 2, wherein each of the interruptions contains features similar in form to features of the periodic structure, but spaced so as to have a pitch substantially different from that of the periodic structure.

5. The method of claim 1, wherein the boundary features are formed by periodic features formed in a boundary region of the periodic structure, the periodic features having a pitch that is an integer multiple of a pitch of the periodic structure itself.

6. The method of claim 1, wherein the boundary features are formed by features formed in a boundary region that divides at least two of the periodic structures within the target structure.

7. The method of claim 1, wherein:
   the target structure contains at least two of the periodic structure; and
   the locations of regions of interest corresponding respectively to the at least two of the periodic structure are calculated using a common set of recognized locations of boundary features.

8. The method of claim 1, wherein:
   the target structure comprises at least two of the periodic structure having periodicity in orthogonal directions;
   the detecting comprises a single image is formed using radiation diffracted in two orthogonal directions, and
   the determining comprises extracting, from the single image, intensities from separate regions of interest corresponding to the at least two of the periodic structures.

9. The method of claim 1, wherein:
   the property of the periodic structure is asymmetry;
   the detecting and determining are repeated to form first and second images using respectively first and second parts of the non-zero order diffracted radiation,
   the method further comprising comparing the intensities extracted from corresponding regions of interest in the first and second images to obtain a measure of asymmetry in one or more of the periodic structures.

10. The method of claim 1, wherein the location of the or each region of interest in the detected images is determined with a precision much finer than the pitch of the periodic structure.

11. An inspection apparatus comprising:
    an illumination arrangement configured to deliver a beam of radiation to a substrate so as to illuminate a target structure on the substrate, the target structure including one or more periodic structures;
    a detection arrangement configured to form and detect an image of the target structure using radiation diffracted from the substrate; and
    a computational arrangement configured to extract intensity values from at least one region of interest within the image of the target structure and to use the extracted values to determine the property the periodic structure,
    wherein the computational arrangement is arranged to recognize locations of a plurality of boundary features in the image of the target structure and to calculating from the recognized locations features a location of the region of interest, and
    wherein, in at least one direction, the number of the boundary features is at least twice a number of boundaries of periodic structures within the target structure.

12. The apparatus of claim 11, wherein the computational arrangement is arranged to recognize boundary features arranged periodically in a boundary region of at least one of the periodic structures.

13. The apparatus of claim 11, wherein the computational arrangement is arranged to calculate the locations of at least two regions of interest in the detected image, by recognizing locations of boundary features arranged in a boundary region that divides at least two of the regions of interest.

14. The apparatus of claim 11, wherein the computational arrangement is arranged to calculate the locations of at least two regions of interest in the detected image using a common set of recognized locations of boundary features.

15. The apparatus of claim 11, wherein:
the property of the periodic structure is asymmetry;
the illumination and detection arrangements are operable to form first and second images of the same target structure using respectively first and second parts of the non-zero order diffracted radiation, and
the computation arrangement is further arranged to compare the intensities extracted from corresponding regions of interest in the first and second images to obtain a measure of asymmetry in one or more of the periodic structures.

16. A lithographic system comprising:
a lithographic apparatus comprising:
an illumination optical system arranged to illuminate a pattern;
a projection optical system arranged to project an image of the pattern onto a substrate; and
an inspection apparatus comprising,
an illumination arrangement configured to deliver a beam of radiation to a substrate so as to illuminate a target structure on the substrate, the target structure including one or more periodic structures;
a detection arrangement configured to form and detect an image of the target structure using radiation diffracted from the substrate; and
a computational arrangement configured to extract intensity values from at least one region of interest within the image of the target structure and to use the extracted values to determine the property the periodic structure,
wherein the computational arrangement is arranged to recognize locations of a plurality of boundary features in the image of the target structure and to calculating from the recognized locations features a location of the region of interest, and
wherein, in at least one direction, the number of the boundary features is at least twice a number of boundaries of periodic structures within the target structure,
wherein the lithographic apparatus is arranged to use the measurement results from the inspection apparatus in applying the pattern to further substrates.

17. A method of manufacturing devices wherein a device pattern is applied to a series of substrates using a lithographic process, the method including:
inspecting at least one periodic structure formed as part of or beside the device pattern on at least one of the substrates:
forming a target structure on a substrate, the target structure including a periodic structure;
detecting an image of the target structure while illuminating the target structure with a beam of radiation, the image being formed using a first part of non-zero order diffracted radiation while excluding zero order diffracted radiation; and
determining a property of the periodic structure using an intensity value extracted from a region of interest within the image of the target structure,
wherein the region of interest is identified in the detected image by recognizing locations of a plurality of boundary features in the image of the target structure and calculating, from the recognized locations, features a location of the region of interest, and wherein, in at least one direction, the number of the boundary features is at least twice a number of boundaries of periodic structures within the target structure, and
controlling the lithographic process for later substrates in accordance with the result of the inspection method.

18. A lithographic system comprising: a lithographic apparatus comprising: an illumination optical system arranged to illuminate a pattern; a projection optical system arranged to project an image of the pattern onto a substrate; and an inspection apparatus comprising an illumination arrangement operable to deliver a beam of radiation to the substrate so as to illuminate a target structure on the substrate, the target structure including one or more periodic structures;
a detection arrangement operable to form and detect an image of the target structure using radiation diffracted from the substrate; and a computational arrangement operable to extract intensity values from at least one region of interest within the image of the target structure and to use the
extracted values to determine the property the periodic structure, wherein the computational arrangement is arranged to recognize locations of a plurality of boundary features in the image of the target structure and to calculating from the recognized locations features a location of the region of interest, and wherein, in at least one direction, the number of the boundary features is at least twice a number of boundaries of periodic structures within the target structure, wherein the lithographic apparatus is arranged to use the measurement results from the inspection apparatus in applying the pattern to further substrates.

19. A method of manufacturing devices wherein a device pattern is applied to a series of substrates using a lithographic process, the method including inspecting at least one periodic structure formed as part of or beside the device pattern on at least one of the substrates using an inspection method comprising, using the lithographic process to form a target structure on the substrate, the target structure including one or more periodic structures on the substrate; forming and detecting at least one image of the target structure while illuminating the target structure with a beam of radiation, the image being formed using a first part of non-zero order diffracted radiation while excluding zero order diffracted radiation; using intensity values extracted from at least one region of interest within the image of the target structure to determine the property of a corresponding one of the periodic structures, wherein to perform step (c), the region of interest is identified in the detected image by recognizing locations of a plurality of boundary features in the image of the target structure and calculating from the recognized locations features a location of the region of interest, and wherein, in at least one direction, the number of the boundary features is at least twice a number of boundaries of periodic structures within the target structure; and controlling the lithographic process for later substrates in accordance with the result of the inspection method.

* * * * *